(12) United States Patent
Kaneko

(10) Patent No.: US 11,956,908 B2
(45) Date of Patent: Apr. 9, 2024

(54) ELECTRONIC CONTROL UNIT AND METHOD FOR MANUFACTURING ELECTRONIC CONTROL UNIT

(71) Applicant: Hitachi Automotive Systems, Ltd., Hitachinaka (JP)

(72) Inventor: Yujiro Kaneko, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 771 days.

(21) Appl. No.: 17/055,509

(22) PCT Filed: Aug. 8, 2019

(86) PCT No.: PCT/JP2019/031315
§ 371 (c)(1),
(2) Date: Nov. 13, 2020

(87) PCT Pub. No.: WO2020/059349
PCT Pub. Date: Mar. 26, 2020

(65) Prior Publication Data
US 2021/0195767 A1 Jun. 24, 2021

(30) Foreign Application Priority Data

Sep. 21, 2018 (JP) ................. 2018-177534

(51) Int. Cl.
*H05K 5/00* (2006.01)
*B29C 45/14* (2006.01)
(Continued)

(52) U.S. Cl.
CPC ..... *H05K 5/0034* (2013.01); *B29C 45/14639* (2013.01); *H01R 12/724* (2013.01);
(Continued)

(58) Field of Classification Search
CPC ............ H05K 5/0034; B29C 45/14639; H01R 12/724; B29K 2063/00; B29K 2067/06; B29L 2031/3425; B60R 16/023
See application file for complete search history.

(56) References Cited

U.S. PATENT DOCUMENTS 9,077,098 B2 *  7/2015  Latunski ............. H01R 43/005
2004/0178514 A1  9/2004  Lee
(Continued)

FOREIGN PATENT DOCUMENTS

JP  2005-093475 A  4/2005
JP  2005-150670 A  6/2005
(Continued)

OTHER PUBLICATIONS

JP2005093475 A; English Translation (Year: 2005).*
(Continued)

*Primary Examiner* — Pete T Lee
(74) *Attorney, Agent, or Firm* — Foley & Lardner LLP

(57) ABSTRACT

Reliability is to be improved. A control board 2 on which an electronic component 1 is mounted and an enclosure 3 in which the control board 2 is sealed with sealing resin 5 are included, wherein the enclosure 3 has a shape in which a volume of resin on one surface side of the control board 2 is larger than a volume of resin on the other surface side, a gate mark 21a is formed in the enclosure 3, a length of the gate mark 21a in a thickness direction of the control board 2 is larger than a thickness of the control board 2, the control board 2 is located such that a side surface partially overlaps a projection region of the gate mark 21a, and the control board 2 is arranged toward the other surface side relative to a center of the gate mark 21a.

9 Claims, 3 Drawing Sheets

(51) Int. Cl.
*H01R 12/72* (2011.01)
*B29K 63/00* (2006.01)
*B29K 67/00* (2006.01)
*B29L 31/34* (2006.01)
*B60R 16/023* (2006.01)

(52) U.S. Cl.
CPC ...... *B29K 2063/00* (2013.01); *B29K 2067/06* (2013.01); *B29L 2031/3425* (2013.01); *B60R 16/023* (2013.01)

(56) References Cited

U.S. PATENT DOCUMENTS

2005/0057902 A1 3/2005 Sasaki
2020/0315026 A1* 10/2020 Muronoi ................ H05K 5/069

FOREIGN PATENT DOCUMENTS

| JP | 2005-191064 A | 7/2005 |
| JP | 2007-273796 A | 10/2007 |
| JP | 2010-040992 A | 2/2010 |

OTHER PUBLICATIONS

WO-2019039244-A1 (Year: 2019).*
International Search Report with English translation and Written Opinion issued in corresponding application No. PCT/JP2019/031315 dated Oct. 15, 2019.

* cited by examiner

ELECTRONIC CONTROL UNIT AND METHOD FOR MANUFACTURING ELECTRONIC CONTROL UNIT

TECHNICAL FIELD

The present invention relates to an electronic control unit and a method for manufacturing the electronic control unit.

BACKGROUND ART

Vehicles are equipped with electronic control units such as an engine control unit and an automatic transmission control unit. In recent years, the electrification of automobiles has been accelerating against the background of environmental problems and energy problems, and the number of electronic control units installed has increased significantly. Accordingly, there is a limited space for installing the electronic control units, and they have to be installed in an engine room, where the conditions are particularly severe in an automobile. Meanwhile, the size of the engine room has been reduced with the increase in the size of the cabin space for improving the comfort of automobiles. Thus, a large number of electronic control units and wire harnesses for electrically connecting them are located in the engine room, whose size is being reduced, and this causes problems of a reduced degree of freedom in layout, increased weight, and hence increased cost. Therefore, size reduction, weight reduction, and cost reduction are required for the electronic control units.

In addition, there is a tendency to shorten the wire harnesses. Accordingly, for example, the engine control unit will be installed at a position closer to the engine, and there is a concern about the effects of high heat and high vibration from the engine. Therefore, it is necessary to improve the heat resistance and vibration resistance of the electronic control units. As a solution to this, a structure is known in which a control board on which electronic components are mounted is sealed with resin (PTL 1). By sealing the control board with resin, the effect of heat on the electronic components can be reduced, and movement of the control board can be suppressed in a vibrating environment.

CITATION LIST

Patent Literature

PTL 1: JP 2007-273796 A

SUMMARY OF INVENTION

Technical Problem

In the module of PTL 1, the electronic circuit board is screw-fixed to a metal base, and sealing resin is charged from one end of the electronic circuit board to complete the molding. However, in order to reduce the weight and cost of the electronic control units in the future, it is essential to reduce the size of the metal base, resulting in a smaller fixed area of the electronic circuit board. Therefore, there is a concern that the electronic circuit board may be warped and deformed by the molding pressure of the sealing resin when the sealing resin is charged. The warping of the electronic circuit board leads to the lowering of the reliability of the electronic control units.

The present invention has been made in view of the above circumstances, and an object of the present invention is to provide an electronic control unit with improved reliability.

Solution to Problem

To solve the above-mentioned problems, an electronic control unit according to an aspect includes: a control board on which an electronic component is mounted; and an enclosure in which the control board is sealed with resin, wherein the enclosure has a shape in which a volume of resin on one surface side of the control board is larger than a volume of resin on the other surface side, a gate mark is formed in the enclosure, a length of the gate mark in a thickness direction of the control board is formed to be larger than a thickness of the control board, the control board is located such that a side surface partially overlaps a projection region of the gate mark, and the control board is arranged toward the other surface side relative to a center of the gate mark.

Advantageous Effects of Invention

According to the present invention, it is possible to provide an electronic control unit with improved reliability.

DESCRIPTION OF EMBODIMENTS

The following describes some embodiments with reference to the drawings. It should be noted that the embodiments described below do not limit the invention defined in the claims, and all of the elements and combinations thereof described in the embodiments are not necessarily essential for the solution of the invention.

First Embodiment

Figure 1:
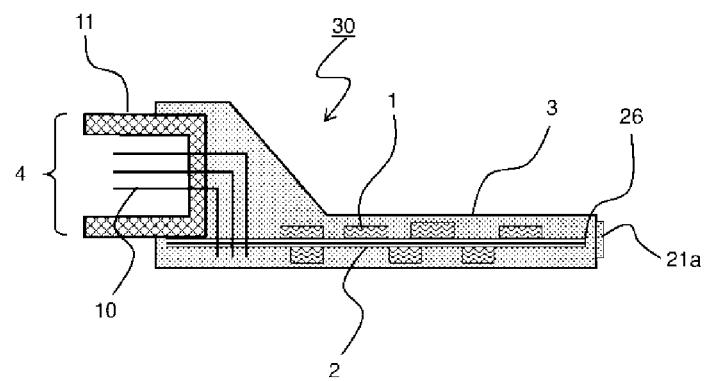
FIG. 1 is a cross-sectional view of an electronic control unit according to a first embodiment.
Figure 2:
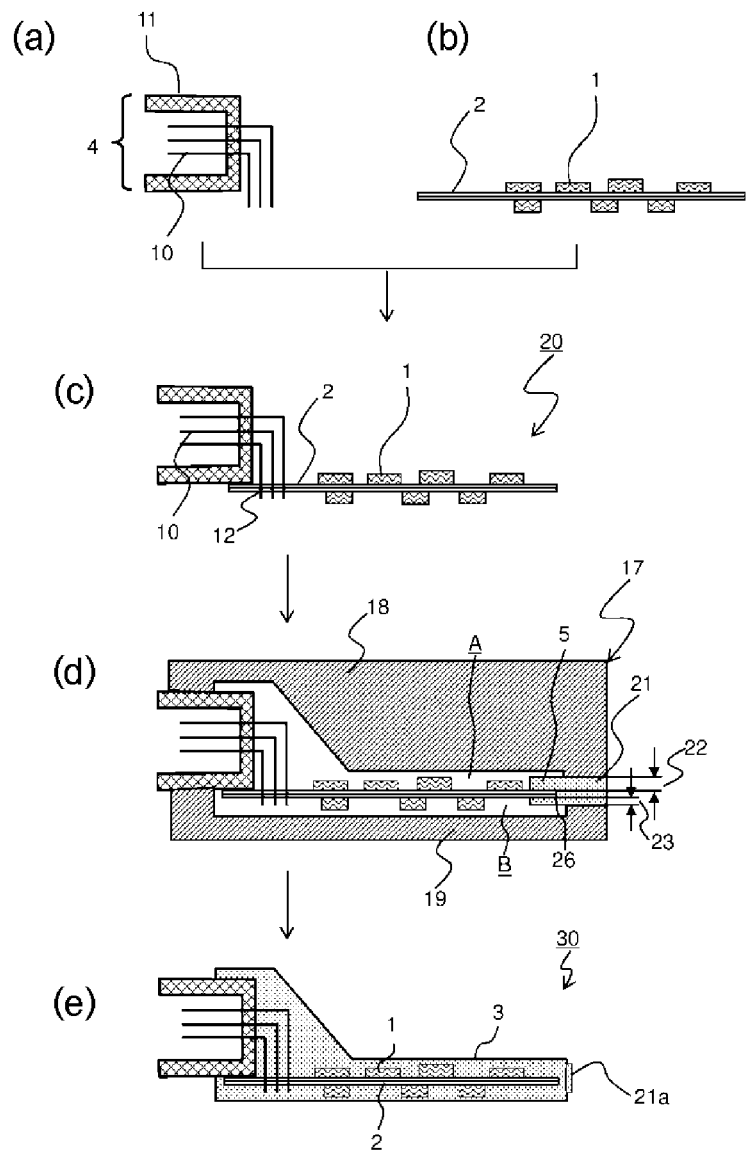
FIG. 2 is an explanatory diagram illustrating a process of assembling the electronic control unit according to the first embodiment.

FIG. 1 is a cross-sectional view showing an electronic control unit of a first embodiment. FIG. 2 is an explanatory diagram illustrating a process of assembling the electronic control unit according to the first embodiment.

As shown in FIGS. 1 and 2, an electronic control unit 30 includes a control board 2 on which an electronic component 1 such as a microcomputer is mounted, a connector 4, and an enclosure 3. The enclosure 3 has a gate mark 21a formed on the side surface opposite to the side on which the connector is formed. A side surface of the control board 2 is provided to be partially located in the projection region of the gate mark 21a. In other words, it is arranged such that the thickness of the control board 2 is smaller than and overlaps the height (length in the thickness direction of the control board 2) of the gate mark 21a in the thickness direction of the enclosure (the thickness direction of the control board 2). The enclosure 3 has a shape in which the volume of the portion on the side on which the connector 4 is formed with respect to the control board 2 is larger than the volume of the portion on the side on which the connector 4 is not formed. The control board 2 is arranged closer to the side on which the connector 4 is not formed than the center of the gate mark 21a in the thickness direction of the enclosure 3.

As shown in FIG. 2(a), the connector 4 includes terminals 10 for connecting vehicle-side harnesses and the control board 2 and a housing 11 for aligning and holding the terminals 10 at a specified pitch. The material of the terminals 10 is preferably copper or a copper alloy from the viewpoints of conductivity, size reduction, and cost. A resin such as PBT (Polybutylene Terephthalate), PA (Polyamide) 66, or PPS (Polyphenylene Sulfide) is preferably used as the material of the housing 11 because of their light weight and excellent heat resistance.

Next, as shown in FIG. 2(b), a plurality of electronic components 1 such as microcomputers are mounted on the front and back surfaces of the control board 2. A resin wiring board based on glass epoxy resin or the like is used for the control board 2. For example, lead-free solder such as Sn—Cu solder, Sn—Ag—Cu solder, or Sn—Ag—Cu—Bi solder is used for connecting the electronic components 1 to the control board 2.

Next, as shown in FIG. 2(c), the connector 4 is mounted to an end portion of the control board 2. To connect the terminals 10 of the connector 4 and the control board 2, through hole portions 12 of the control board 2 into which the terminals 10 are inserted are connected with lead-free solder such as Sn—Cu solder, Sn—Ag—Cu solder, or Sn—Ag—Cu—Bi solder. The type of the connector 4 may be either a surface-mount type or a press-fit type.

As shown in FIG. 2(d), a sub-assy 20 thus prepared is set in a mold 17 for resin sealing. The mold 17 includes an upper mold 18 and a lower mold 19 covering both sides of the control board 2 in the thickness direction. In this embodiment, after the sub-assy 20 is set on the upper mold 18, which serves as a movable mold, the upper mold 18 is moved and set on the lower mold 19, which serves as a fixed mold.

Figure 3:
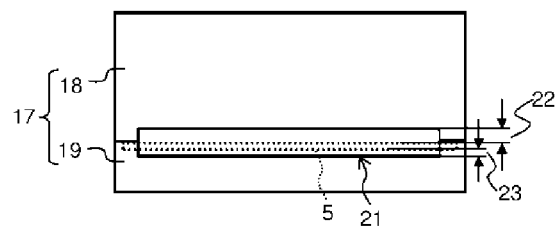
FIG. 3 is a side view of the electronic control unit according to the first embodiment.

FIG. 3 is a side view of the electronic control unit according to the first embodiment.

Referring together to FIG. 3, a gate portion 21, which is an injection port of sealing resin 5 as an example of the "resin", is provided between the upper mold 18 and the lower mold 19. The gate portion 21 has a rectangular opening, and is provided near one end 26 of the control board 2 so as to face it. In this manner, the sealing resin 5 injected into the mold 17 from the gate 2 flows in parallel with the plane direction of the control board 2. Further, the height (length in the thickness direction of the control board 2) of the opening (cross section) of the gate portion 21 is formed to be larger than the thickness of the control board 2. Although an example is shown in which the width (length in the surface direction of the control board 2) of the opening of the gate portion 21 is formed to be smaller than the width of the control board 2, there is no such limitation.

Referring back to FIG. 2(d), FIG. 2(d) illustrates a progress of charging the sealing resin 5 injected from the gate portion 21. The height of the cross section of the gate portion 21 is larger than the thickness of the control board 2. This allows the sealing resin 5 to smoothly flow into the mold 17.

Further, the connector 4 is provided on the downstream side of a resin flow path A on the upper surface side of the control board 2. In other words, the connector 4 is formed on the side of the control board 2 opposite to the gate mark 21a. This can better suppress the generation of voids due to the terminals 10 than in the case where the connector 4 is provided on the upstream side of the resin flow path A.

Here, the connector 4 is mounted on one surface (hereinafter, upper surface) side of the control board 2. Since the connector 4 also needs to be sealed with the sealing resin 5, the volume of the sealing resin 5 is larger on the opposite surface (hereinafter, lower surface) side of the control board 2 than the upper surface side. In this case, the charging of the sealing resin 5 is finished at different timings between the upper and lower surface sides of the control board 2 in the mold 17, which causes a difference in pressure from the sealing resin 5 between the upper and lower surfaces of the control board 2. This causes the control board 2 to be warped, and if the charging of the sealing resin 5 is finished while the control board 2 is warped, a residual strain occurs in the control board 2. This residual strain causes cracks at the solder connection portions during manufacture, resulting in a lowered yield. Thus, in this embodiment, the difference in pressure from the sealing resin 5 between the upper and lower surfaces of the control board 2 is to be reduced when the sealing resin 5 is charged into the mold 17, in order to suppress the warping of the control board 2. That is, the difference in time at which the charging of the sealing resin 5 is finished between the upper and lower surface sides of the control board 2 is to be reduced. More preferably, the charging of the sealing resin 5 into the mold 17 is finished at the same timing on the upper and lower surface sides of the control board 2.

In this embodiment, the volume of the sealing resin 5 is larger on the upper surface side of the control board 2 than on the lower surface side. Therefore, in order to reduce the difference in timing at which the charging of the sealing resin 5 is finished between the upper and lower surface sides of the control board 2, the cross-sectional area (S1') of the resin flow path A on the upper surface side of the control board 2 is set to be larger than the cross-sectional area (S2') of the resin flow path B on the lower surface side of the control board 2. A substrate 5 is arranged in the mold 17 such that the relationship between the area of the gate portion 21 on the upper surface side of the control board 2 (S1) and the area of the gate portion 21 on the lower surface side of the control board 2 (S2) is S2<S1.

More preferably, the charging into the mold 17 is finished at the same timing on the upper and lower sides of the control board 2. That is, the ratio of the cross-sectional areas of both resin flow paths A and B is set such that the charging of the sealing resin 5 injected from the resin flow path A and the sealing resin 5 injected from the resin flow path B into the mold 17 is finished at the same timing on the upper and lower surface sides of the control board 2.

For example, the volume ratio between the volume of the sealing resin 5 on the upper surface side of the control board 2 (V1) and the volume of resin on the lower surface side of the control board 2 (V2<V1) is substantially equal to the area ratio between the cross-sectional area of the gate portion 21 on the upper surface side of the control board 2 (S1) and the cross-sectional area of the gate portion 21 on the lower surface side of the control board 2 (S2<S1). That is, the control board 2 is arranged in the mold 17 such that a relationship of V1:V2≈S1:S2 holds.

The width of the cross section of the resin flow path A and the width of the cross section of the resin flow path B are substantially equal to each other. In this manner, the sealing resin 5 spreads equally and in a balanced manner on both sides of the control board 2 while being charged. Therefore, the height, 22, of the cross section of the resin flow path A is higher than the height, 23, of the cross section of the resin flow path B.

In order to obtain a sufficient fluidity of the sealing resin 5 and charge the sealing resin 5 finely in the mold 17, it is preferable to preheat the mold 17, the sub-assy 20, and the sealing resin 5. The sealing resin 5 may be a thermosetting epoxy resin, an unsaturated polyester resin, or a thermoplastic resin. The sealing method may be transfer molding, compression molding, injection molding, or hot melt. The sealing resin 5 preferably has a coefficient of linear expansion of 10 to $30 \times 10^{-6}/°$ C. and a thermal conductivity of 0.5 to 3 W/mK, depending on the physical property values of the control board 2. This can suppress the peeling between the sealing resin 5 and the control board 2.

After the charging of the sealing resin 5 into the mold 17 is finished, the sealing resin 5 is cured in the mold 17. After the curing, the mold 17 is opened, and the resin molded product is taken out. After excess regions of the gate portion 21 are removed, the electronic control unit 30 shown in FIG. 2(e) is completed. The gate mark 21a is formed when the excess regions of the gate portion 21 are removed.

In this embodiment, the resin enclosure 3 has a shape in which the volume of resin on one surface side of the control board 2 is larger than the volume of resin on the other surface side, the length of the gate mark 21a in the thickness direction of the control board 2 is formed to be larger than the thickness of the control board 2, the control board 2 is located such that a side surface partially overlaps the projection region of the gate mark 21a, and the control board 2 is arranged toward one surface side relative to the center of the gate mark 21a. With this structure, it is possible to reduce the difference in the resin charging timing between one surface side and the other surface side of the control board 2 during the molding, suppress the warping of the control board 2 during the molding, and improve the reliability of the electronic control unit 30. Further, since the control board 2 is resin-sealed, the size reduction, weight reduction, and cost reduction of the electronic control unit 30 can be achieved.

In addition, more preferably, in order to make the resin charging timings the same (substantially eliminate the difference), the area ratio (S1/S2) between the area S1 of the gate mark 21a on one surface side of the control board 2 and the area S2 of the gate mark 21a on the other surface side of the control board 2 and the volume ratio (V1/V2) between the volume V1 of the enclosure 3 on one surface side of the control board 2 and the volume V2 of the enclosure 3 on the other surface side of the control board 2 are formed to be substantially equal to each other. In this manner, the warping of the control board 2 can be further suppressed, and the reliability can be further improved.

Further, since the resin flow paths A and B branch off at the one end 26 of the control board 2 toward the upper and lower surfaces of the control board 2, the pressure of the sealing resin 5 and 5 injected into the resin flow paths A and B can be adjusted by changing the arrangement and shapes of the gate portion 21 and the control board 2.

The height 22 of the cross-sectional area of the resin flow paths A and B is set to be larger than the thickness of the control board 2, and the control board 2 is arranged such that the one end 26 faces the resin flow paths A and B. In this manner, the pressure of the sealing resin 5 and 5 charged into the resin flow paths A and B can be adjusted by changing the arrangement of the one end 26 of the control board 2.

Since the cross-sectional area (S1') of the resin flow path A on the side of the control board 2 on which the connector 4 is arranged is larger than the cross-sectional area (S2') of the resin flow path B on the side of the control board 2 on which the connector 4 is not arranged, it is possible to suppress the warping of the control board 2 while sealing the connector 4.

Second Embodiment

A second embodiment will be described in comparison with the first embodiment. A mold 27 according to the second embodiment is different from the mold 17 according to the first embodiment only in the structure of the gate portion, and the other structures are the same as those of the mold 17 according to the first embodiment. Thus, the differences from the first embodiment will be mainly described.

Figure 4:
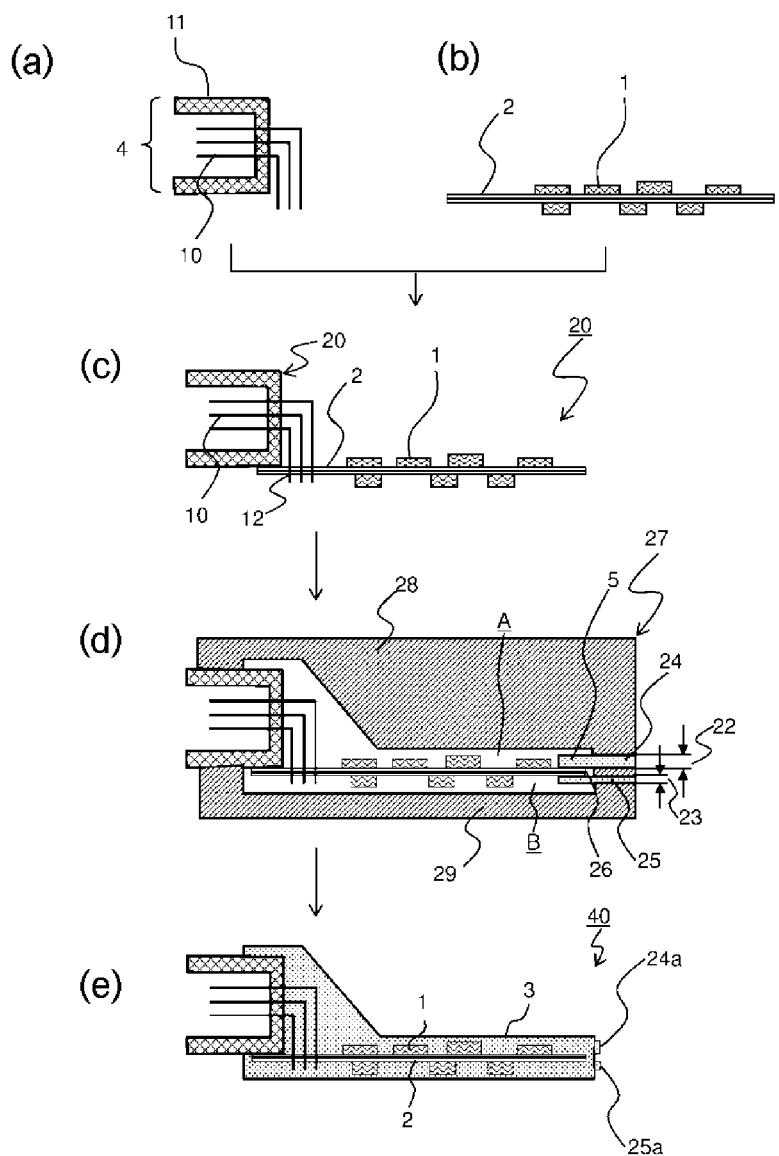
FIG. 4 is an explanatory diagram illustrating a process of assembling an electronic control unit of a second embodiment.

FIG. 4 is an explanatory diagram illustrating a process of assembling an electronic control unit of the second embodiment.

Although the gate portion 21 has a single structure as shown in FIG. 2(d) in the first embodiment, in the second embodiment, the gate portion 21 has a double structure in which a first gate portion 24 and a second gate portion 25 are provided as shown in FIG. 4(d).

That is, the first gate portion 24 and the second gate portion 25 are provided to the mold 27 so as to sandwich the control board 2. They are shaped such that the size (area) of the first gate portion 24 is larger than the size (area) of the second gate portion 25.

Figure 5:
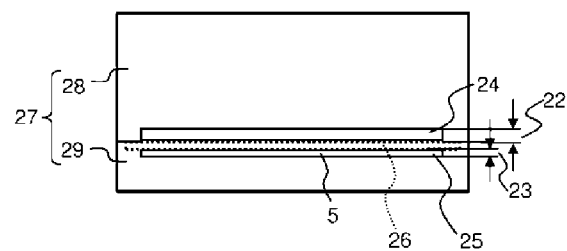
FIG. 5 is a side view of the electronic control unit according to the second embodiment.

FIG. 5 is a side view of the electronic control unit according to the second embodiment.

As shown in FIG. 4(d), the first gate portion 24 is provided to the upper mold 18, and the second gate portion 25 is provided to the lower mold 19. After the charging of the sealing resin 5 into the mold 27 is finished, the sealing resin 5 is cured in the mold 27. After the curing, the mold 27 is opened, and the resin molded product is taken out. After the excess regions of the first gate portion 24 and the second gate portion 25 are removed, an electronic control unit 40 shown in FIG. 4(e) is completed. Gate marks 24a and 25a are formed in the enclosure 3 in the removal step.

As shown in FIG. 4 (e), a first gate mark 24a and a second gate mark 25a are formed in the enclosure 3. The first gate mark 24a is formed in the portion of the enclosure 3 on the surface side of the control board 2 on which the connector 4 is arranged, and the second gate mark 25a is formed in the portion of the enclosure 3 on the surface side of the control board 2 on which the connector 4 is not arranged. The enclosure 3 has a shape in which the volume of the portion on the side on which the connector 4 is formed with respect to the control board 4 is larger than the volume of the portion on the side on which the connector 4 is not formed with respect to the control board 2. The size (area) of the first gate mark 24a is larger than the size (area) of the second gate mark 25a.

In this embodiment, the resin enclosure 3 has a shape in which the volume of resin on one surface side of the control board 2 is larger than the volume of resin on the other surface side, the enclosure 3 has the first gate mark 24a formed on one surface side of the control board 2 and the second gate mark 25a formed on the other surface side of the control board 2, and the first gate mark 24a is larger than the second gate mark 25a. With this arrangement, it is possible to suppress the warping of the control board 2 and improve the reliability as in the first embodiment. Further, by dividing the gate such that the one end 26 of the control board 2 does not overlap the projection region, the sealing resin 5 is less likely to contact the one end 26 of the control board, and it becomes easier to control the flow of the sealing resin 5. Thus, it becomes easier to suppress the warping of the control board 2 than in the first embodiment.

In addition, as a further preferred example, formation is performed such that the volume ratio between the volume of the enclosure 3 on one surface side of the control board 2 and the volume of the enclosure 3 on the other surface side of the control board 2 and the area ratio between the area of the first gate mark 24a and the area of the second gate mark 25a are substantially equal to each other, so that the charging timings on the upper and lower sides (one surface side and the other surface side) of the control board 2 are the same. Thus, the warping of the board can be further suppressed, and the reliability is improved.

In addition, the length of the first gate mark 24a in the thickness direction of the control board 2 is made larger than the length of the second gate mark 25a in the thickness direction of the control board 2, the length of the first gate mark 24a in the surface direction of the control board 2 is substantially equal to the length of the second gate mark 25a in the surface direction of the control board 2, and the sizes of the first gate portion 24 and the second gate portion 25 in the height direction are changed. Thus, it is possible to efficiently adjust the resin injection speeds on the upper and lower sides and reduce the height.

Third Embodiment

A third embodiment will be described in comparison with the first embodiment. A mold 37 according to the third embodiment is different from the mold 17 according to the first embodiment only in the structure of the gate portion, and the other structures are the same as those of the mold 17 according to the first embodiment. Thus, the differences from the first embodiment will be mainly described.

Figure 6:
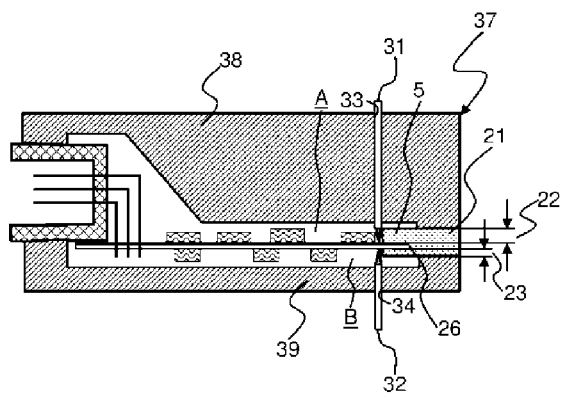
FIG. 6 is a cross-sectional view of an electronic control unit according to a third embodiment.

FIG. 6 is a cross-sectional view of an electronic control unit according to the third embodiment.

The mold 37 is additionally provided with a pair of movable pins 31 and 32. More specifically, the upper mold 38 is provided with a through hole 33, and a movable pin 51 is inserted into the through hole 33. The lower mold 39 is provided with a through hole 34, and a movable pin 52 is inserted into the through hole 34.

Figure 7:
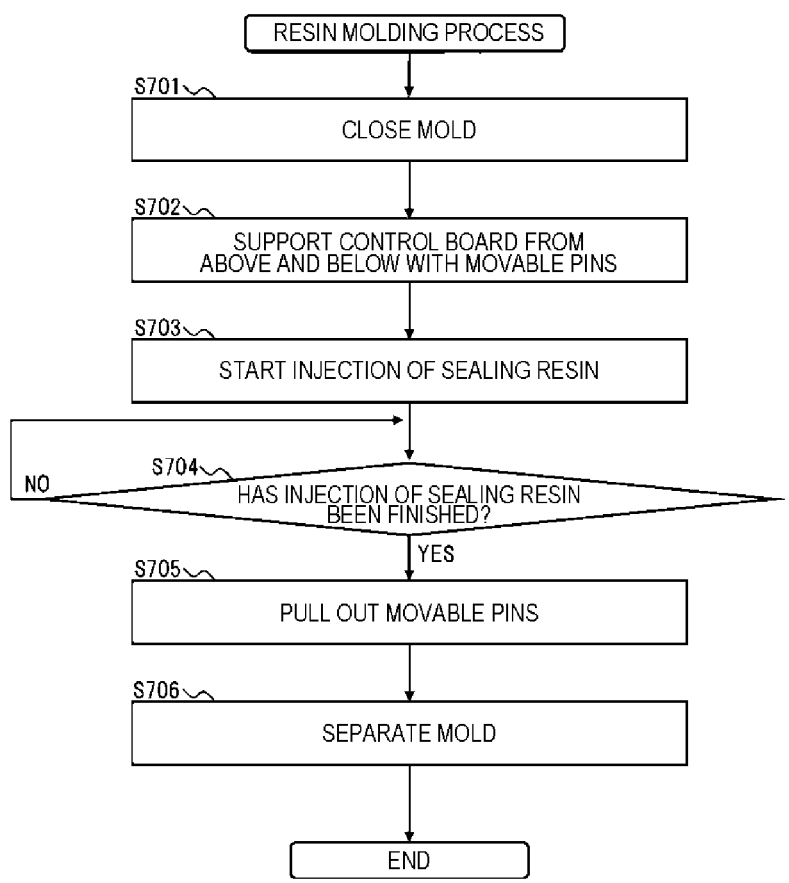
FIG. 7 is a flow diagram illustrating a process of molding the electronic control unit according to the third embodiment.

FIG. 7 is a flow diagram illustrating a process of molding the electronic control unit according to the third embodiment.

A process of molding an electronic control unit 50 will now be described. First, while the pair of movable pins 31 and 32 are inserted into the pair of through holes 33 and 34, respectively, the mold 37 is closed such that the upper and lower sides of the control board 3 are arranged between the upper mold 38 and the lower side 39 (S701). Then, the pair of movable pins 31 and 32 are brought close to the control board 2, the control board 2 is supported from above and below with the pair of movable pins 31 and 32 (S702), and the injection of the sealing resin 5 is started from the gate portion 21 (S703). Next, it is determined whether the injection of the sealing resin 5 has been finished (S704). If the determination of S704 is affirmative (S704: YES), after the sealing resin 5 is cured, the pair of movable pins 31 and 32 are separated from the control board 2 and pulled out from the upper mold 38 and the lower mold 39. (S705). Finally, the upper mold 38 and the lower mold 39 are separated (S706).

With this arrangement, since the pair of movable pins 31 and 32 support the control board 2, it is possible to suppress the warping of the control board 2 while the sealing resin 5 is charged.

Although the embodiments of the electronic control unit according to the present invention have been described in detail above, the present invention is not limited to the above-described embodiments, and various design changes can be made without departing from the spirit of the present invention defined in the claims.

REFERENCE SIGNS LIST 1 electronic component
2 control board
3 enclosure
4 connector
5 sealing resin
10 terminal
17 mold
21 gate portion
21a gate mark
22 height of cross section of resin flow path A
23 height of cross section of resin flow path B
24 first gate portion
24a gate mark
25 second gate portion
25a gate mark
26 one end
27 mold
30 electronic control unit
31 movable pin
32 movable pin
37 mold
40 electronic control unit
A resin flow path
B resin flow path

The invention claimed is:
1. An electronic control unit comprising:
a control board on which an electronic component is mounted; and
an enclosure in which the control board is sealed with resin,
wherein the enclosure has a shape in which a volume of resin on a first surface side of the control board is larger than a volume of resin on a second surface side,
a gate mark is formed in the enclosure,
a length of the gate mark in a thickness direction of the control board is formed to be larger than a thickness of the control board,
the control board is located such that a side surface partially overlaps a projection region of the gate mark,
the control board is arranged toward the second surface side relative to a center of the gate mark, and
an area ratio between an area of the gate mark on the first surface side with respect to the control board and an area of the gate mark on the second surface side with respect to the control board and a volume ratio between a volume of the enclosure on the first surface side with respect to the control board and a volume of the enclosure on the second surface side with respect to the control board are formed to be substantially equal to each other.

2. An electronic control unit comprising:
- a control board on which an electronic component is mounted; and
- an enclosure in which the control board is sealed with resin,
- wherein the enclosure has a shape in which a volume of resin on a first surface side of the control board is larger than a volume of resin on a second surface side,
- the enclosure has a first gate mark formed on the first surface side of the control board and a second gate mark formed on the second surface side of the control board, and
- the first gate mark is larger than the second gate mark.

3. The electronic control unit according to claim 2, wherein a volume ratio between a volume of the enclosure on the first surface side of the control board and a volume of the enclosure on the second surface side of the control board and an area ratio between an area of the first gate and an area of the second gate are formed to be substantially equal to each other.

4. The electronic control unit according to claim 3, wherein
- a length of the first gate mark in a thickness direction of the control board is larger than a length of the second gate mark in the thickness direction of the control board, and
- a length of the first gate mark in a surface direction of the control board is substantially equal to a length of the second gate mark in the surface direction of the control board.

5. The electronic control unit according to claim 1, comprising a connector having a terminal electrically connected to the control board and mounted on the first surface side of the control board,
- wherein the gate mark is formed on a side surface of the enclosure opposite to a side on which the connector is formed.

6. The electronic control unit according to claim 5, wherein the resin has a coefficient of linear expansion of 10 to 30×10'6/° C. and a thermal conductivity of 0.5 to 3.0 W/mK.

7. A method for manufacturing an electronic control unit, the method comprising:
- arranging a control board in a mold; and
- sealing the control board in an enclosure by injecting resin into the mold,
- wherein the enclosure has a shape in which a volume on a first surface side is larger than a volume on a second surface side, and includes a resin flow path in which resin injected toward the control board branches off toward the first surface side and the second surface side of the control board,
- a cross-sectional area of the branched resin flow path is formed to be larger on the first surface side of the control board than on the second surface side, and
- an area ratio between an area of the gate mark on the first surface side with respect to the control board and an area of the gate mark on the second surface side with respect to the control board and a volume ratio between a volume of the enclosure on the first surface side with respect to the control board and a volume of the enclosure on the second surface side with respect to the control board are formed to be substantially equal to each other.

8. The method for manufacturing an electronic control unit according to claim 7, wherein a volume ratio of the enclosure between the first surface side and the second surface side is formed to be substantially equal to a corresponding cross-sectional area ratio of the resin flow path.

9. The method for manufacturing an electronic control unit according to claim 8, wherein the control board is supported from both sides in a thickness direction with movable pins.

* * * * *